United States Patent
Sato et al.

(10) Patent No.: US 9,722,541 B2
(45) Date of Patent: Aug. 1, 2017

(54) DISTRIBUTED AMPLIFIER

(71) Applicant: FUJITSU LIMITED, Kawasaki-shi, Kanagawa (JP)

(72) Inventors: Masaru Sato, Isehara (JP); Naoko Kurahashi, Isehara (JP)

(73) Assignee: FUJITSU LIMITED, Kawasaki (JP)

( * ) Notice: Subject to any disclaimer, the term of this patent is extended or adjusted under 35 U.S.C. 154(b) by 0 days.

(21) Appl. No.: 15/045,860

(22) Filed: Feb. 17, 2016

(65) Prior Publication Data

US 2016/0261237 A1 Sep. 8, 2016

(30) Foreign Application Priority Data

Mar. 6, 2015 (JP) .................... 2015-045237

(51) Int. Cl.
*H03F 3/60* (2006.01)
*H03F 1/02* (2006.01)
*H03F 1/18* (2006.01)
*H03F 1/42* (2006.01)
*H03F 3/193* (2006.01)
(Continued)

(52) U.S. Cl.
CPC ............ *H03F 1/0205* (2013.01); *H03F 1/18* (2013.01); *H03F 1/42* (2013.01); *H03F 1/56* (2013.01);
(Continued)

(58) Field of Classification Search
CPC .......... H03F 1/0288; H03F 1/07; H03F 3/211; H03F 3/602; H03F 3/605; H03F 3/68; H03F 3/60; H03F 3/607
(Continued)

(56) References Cited

U.S. PATENT DOCUMENTS 4,754,244 A * 6/1988 Pavio ................ H03B 19/14
330/286
4,973,918 A 11/1990 Schindler
(Continued)

FOREIGN PATENT DOCUMENTS

EP 0704965 4/1996
FR 2759508 8/1998
(Continued)

OTHER PUBLICATIONS

EESR—The Extended European Search Report dated Jul. 28, 2016 from corresponding European Patent Application No. 16154839.1.
(Continued)

*Primary Examiner* — Khanh V Nguyen
(74) *Attorney, Agent, or Firm* — Fujitsu Patent Center (57) ABSTRACT

A distributed amplifier includes: an input-side transmission line; M amplification circuits; M output-side transmission lines; and a combination circuit configured to combine outputs of the M output-side transmission lines; wherein the input-side transmission line has an input-side serial line formed by connecting in series M×N unit transmission lines each including the same line length, and an input-side terminating resistor, the M amplification circuits each includes N amplifiers and the N amplifiers of the i-th amplification circuit take the input node of the ((k−1) M+i)-th input-side transmission line to be the input, and the output-side transmission line includes an output-side serial line including N transmission lines each being connected in series between the neighboring outputs of the N amplifiers and each having a line width in which the phase of the output of the amplifier in each stage agrees with one another.

10 Claims, 9 Drawing Sheets

(51) Int. Cl.
 H03F 3/195 (2006.01)
 H03F 3/72 (2006.01)
 H03F 1/56 (2006.01)
 H03F 1/07 (2006.01)
(52) U.S. Cl.
 CPC ............. *H03F 3/193* (2013.01); *H03F 3/195* (2013.01); *H03F 3/604* (2013.01); *H03F 3/607* (2013.01); *H03F 3/72* (2013.01); *H03F 1/0288* (2013.01); *H03F 1/07* (2013.01); *H03F 2200/27* (2013.01); *H03F 2200/315* (2013.01); *H03F 2200/36* (2013.01); *H03F 2200/42* (2013.01); *H03F 2200/423* (2013.01); *H03F 2200/451* (2013.01); *H03F 2200/48* (2013.01); *H03F 2200/519* (2013.01); *H03F 2200/555* (2013.01); *H03F 2200/75* (2013.01); *H03F 2203/7227* (2013.01)
(58) Field of Classification Search
 USPC ................................. 330/54, 124 R, 286, 295
 See application file for complete search history.

(56) References Cited

U.S. PATENT DOCUMENTS

| | | | | |
|---|---|---|---|---|
| 5,177,381 A | * | 1/1993 | Friesen | .................. H03G 7/001 330/54 |
| 5,469,108 A | * | 11/1995 | Tserng | ................. H01L 27/0207 330/286 |
| 5,519,358 A | | 5/1996 | Tserng | |
| 6,798,281 B2 | * | 9/2004 | Dueme | ..................... H03F 1/22 330/286 |
| 7,636,017 B2 | * | 12/2009 | Sasaki | ....................... H03F 1/32 330/54 |
| 2012/0038424 A1 | | 2/2012 | Guo | |

FOREIGN PATENT DOCUMENTS

| | | |
|---|---|---|
| JP | 06-13806 | 1/1994 |
| JP | 08-78976 | 3/1996 |
| JP | 2005-086634 | 3/2005 |

OTHER PUBLICATIONS

Kimura et al., "Artificial-Line-Division Distributed ICs With 0.1-um-Gate-Length GaAs MESFET and Three-Dimensional Transmission Lines," IEEE Transactions on Microwave Theory and Techniques, vol. 50, No. 6, pp. 1603-1608, Jun. 2002. (XP011076604A).
Dennler et al., "8-42GHz GaN Non-Uniform Distributed Power Amplifier MMICs in Microstrip Technology," IEEE, Jun. 2012. (XP32217120A).
Philippe Dennler et al., "8-42 GHz GaN Non-Uniform Distributed Power Amplifier MMICs in Microstrip Technology", IEEE 2012.

* cited by examiner

DISTRIBUTED AMPLIFIER

CROSS-REFERENCE TO RELATED APPLICATION

This application is based upon and claims the benefit of priority of the prior Japanese Patent Application No. 2015-045237, filed on Mar. 6, 2015, the entire contents of which are incorporated herein by reference.

FIELD

The technique disclosed herein relates to a distributed amplifier.

BACKGROUND

Due to the recent development of broadband, the demand for large-capacity high-speed radio communication is increasing. As the capacity of communication has increased, a third generation has become widespread for mobile phones and further, a fourth generation will develop in the future. Due to this, a wideband amplifier for transmission that is used in a based station of a mobile phone, an increase in output power and improvement of efficiency are further demanded.

The above-described wideband amplifier is also used in the transmission unit of a radar. For the radar's high power amplifier, an increase in output power, an increase in band, and improvement of efficiency are further demanded for extension of detection distance and improvement of resolution. If high efficiency is achieved, power that is consumed as heat is reduced, and therefore, the cooling unit may be more compact and it is possible to reduce the size and cost.

In order to increase output power, the transistor size is increased and further, an integrated circuit is formed by using a high power transistor capable of a large current operation on a high voltage, for example, a GaN HEMT.

Further, as a method for creating a design to widen the band, a distributed amplifier is known. The distributed amplifier has an input-side transmission line, an amplification circuit, and an output-side transmission line. On the input-side transmission line, input terminals in a plurality of amplification stages of the amplification circuit are sequentially connected periodically, and in the output-side transmission line also, output terminals in a plurality of amplification stages are sequentially connected periodically. Further, the opposite side of the input terminal of the input-side transmission line is terminated with a resistor and the opposite side of the output terminal of the output-side transmission line is terminated with a resistor.

The above-described distributed amplifier has an advantage that gain is constant across wide frequencies, but there is a problem in that efficiency (output power/power consumed as DC) is reduced because the terminating resistor absorbs power.

In order to solve the above-described problem, it has been proposed that the output-side terminator (terminating resistor) is removed and the width of the transmission line in each stage of the output-side transmission line is gradually increased in the above-described distributed amplifier. The line width corresponds to the magnitude of impedance. The signal that is amplified in the amplification stage is guided to the output-side transmission line, flows through the thick transmission line whose impedance is low, and is guided to the output terminal. This distributed amplifier does not use a terminator, and therefore, the power that is consumed as DC (direct current) is reduced, and as a result, high efficiency is achieved.

The output power of the distributed amplifier is in proportion to the output power of the unit amplifier in each amplification stage and the number of stages. Consequently, if the number of amplification stages is increased, it is possible to increase the output power of the distributed amplifier. However, as described previously, if the number of stages is increased, it is also necessary to increase the line width of the transmission line in each stage of the output-side transmission line, and in view of the layout, it is not possible to increase the number of stages so much (normally, about five to ten stages).

Further, the cutoff frequency of the distributed amplifier is considered. The cutoff frequency is the upper limit frequency at which the amplification factor is 1 or higher, corresponding to the upper limit frequency of the wideband amplifier. The cutoff frequency of the distributed amplifier is in inverse proportion to the product of the capacitance that is represented by an equivalent circuit of the amplification stage and the square root of the number of stages. Because of this, if the size of the transistor that is used in the amplification stage is increased for the purpose of increasing the output power, the cutoff frequency is reduced. Similarly, there is a problem in that the cutoff frequency is reduced even if the number of stages is increased.

On the other hand, it has been proposed to branch the circuit into two distributed amplifiers from the input-side transmission line and to combine their outputs. Due to this, it is possible to halve the size of the transistor that is used in the amplification stage although the total transistor size is the same, and in the case where the circuit is branched from the same portion of the input-side transmission line, the two amplification stages are connected, and therefore, the total capacitance is the same and it is not possible to increase the cutoff frequency.

Related-art techniques are disclosed in
Japanese Laid Open Patent Publication No. H08-078976,
Japanese Laid Open Patent Publication No. H06-013806,
Japanese Laid Open Patent Publication No. 2005-086634 and
Philippe Dennler, et al., "8-42 GHz GaN Non-Uniform Distributed Power Amplifier MMICs in Microstrip Technology", IMS2012.

SUMMARY

According to a first aspect of embodiments, a distributed amplifier includes: an input-side transmission line; M (M: integer not less than 2) amplification circuits; M output-side transmission lines provided in accordance with the M amplification circuits; and a combination circuit configured to combine outputs of the M output-side transmission lines; wherein the input-side transmission line includes an input-side serial line formed by connecting in series M×N (N: integer not less than 2) unit transmission lines each including the same line length, and an input-side terminating resistor, the M amplification circuits each includes N amplifiers and the N amplifiers of the i-th (i: integer not less than 1 and not more than M) amplification circuit take the input node of the ((k−1) M+i)-th (k: integer not less than 1 and not more than N) input-side transmission line to be the input, and the output-side transmission line includes an output-side serial line including N transmission lines each being connected in series between the neighboring outputs of the N amplifiers and each including a line width with which the phase of the output of the amplifier in each stage agrees to one another.

The object and advantages of the embodiments will be realized and attained by means of the elements and combination particularly pointed out in the claims.

It is to be understood that both the foregoing general description and the following detailed description are exemplary and explanatory and are not restrictive of the invention.

DESCRIPTION OF EMBODIMENTS

Before explaining the distributed amplifier of the embodiment, the background art of the distributed amplifier will be explained.

A distributed amplifier having an input-side transmission line, an amplification circuit, and an output-side transmission line is known. In this distributed amplifier, input terminals in the amplification stage are sequentially connected periodically on the way of the input-side transmission line, and in the output-side transmission line also, output terminals in the amplification stage are sequentially connected periodically. Further, in this distributed amplifier, the opposite side of the input terminal of the input-side transmission line is terminated with a resistor and the opposite side of the output terminal of the output-side transmission line is terminated with a resistor.

The above-described distributed amplifier has an advantage that gain is constant across wide frequencies, but there is a problem in that efficiency (output power/power consumed as DC) is reduced because the terminating resistor absorbs power. Non-Patent document 1 has proposed a distributed amplifier from which the output-side terminator (terminating resistor) has been removed in order to improve efficiency.

Figure 1:
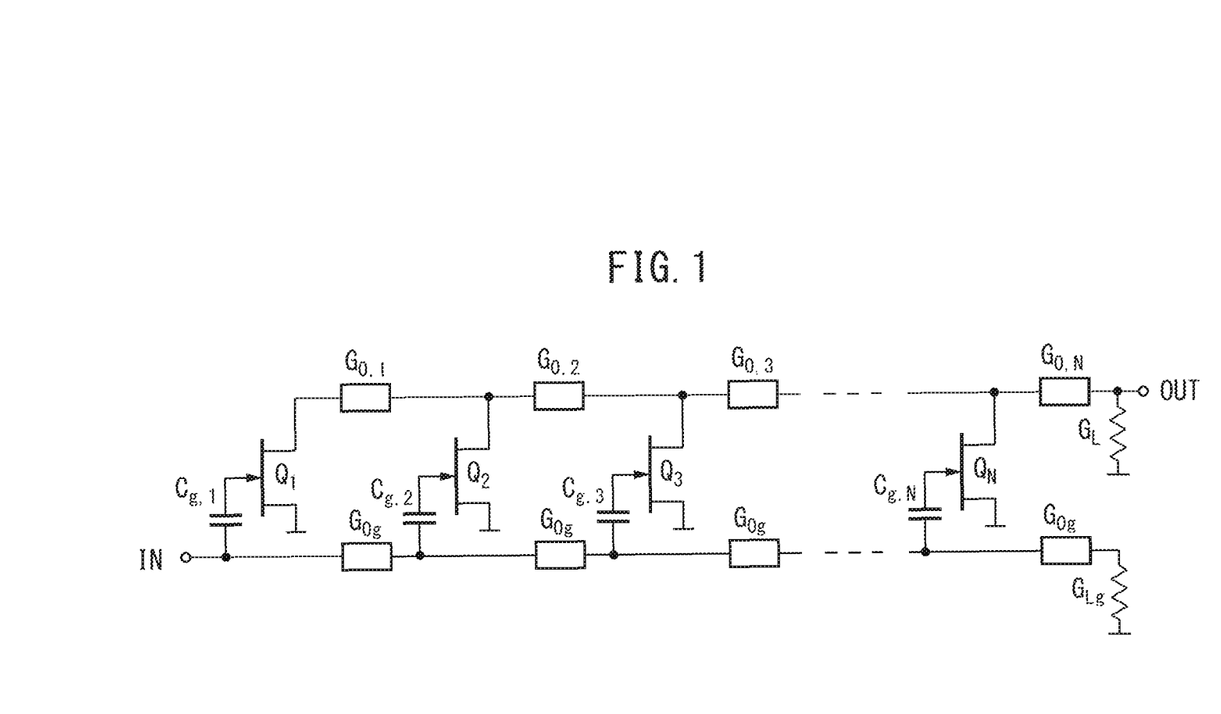
FIG. 1 is a diagram illustrating the distributed amplifier disclosed in Non-Patent Document 1.

FIG. 1 is a diagram illustrating the distributed amplifier disclosed in Non-Patent Document 1.

The input-side transmission line is formed by connecting in series the N unit lines $G_{0g}$ having the length L and the terminating resistor $G_{Lg}$ between the input terminal IN and the reference potential source (0 V). In correspondence to the N unit lines $G_{0g}$, the N amplification transistors $Q_1$ to $Q_N$ are arranged and the gate of the kth (k: integer not less than 1 and not more than N) amplification transistor $Q_k$ is connected to the node on the input terminal side of the kth unit line $G_{0g}$ via a capacitor $C_{g,k}$. Consequently, the gate of the first amplification transistor $Q_1$ is connected to the node on the input terminal side of the first unit line $G_{0g}$, i.e., the input terminal IN. One of the terminals of each amplification transistor $Q_k$ is connected to the reference potential source (0 V) and the amplified signal is output from the other terminal. Each of the N unit lines $G_{0,k}$ is connected between the other terminals adjacent to each other of the amplification transistors $Q_1$ to $Q_N$. The N unit lines $G_{0,k}$ form the output-side transmission line and the node of the Nth unit line $G_{0,N}$ is connected to the output terminal OUT. The output terminal OUT is connected to the power source (VDD) via the output load $G_L$. To the output terminal OUT, the element (e.g., antenna or the like) next to the amplifier is connected.

In the distributed amplifier in FIG. 1, the unit lines $G_{0,k}$ of the output-side transmission line are set so that the line width increases gradually. The magnitude of the line width corresponds to the magnitude of impedance. The signal amplified in the amplification stage (transistor) is guided to the output-side transmission line, but the unit line on the side of the output terminal OUT and the unit line on the opposite side are connected, and therefore, the amplified signal can propagate to either line. Consequently, as described above, the line width is gradually increased and to the output terminal of the transistor, a thin line (opposite side) and a thick line (output terminal side) are connected. The output signal of the transistor flows through a thick line having low impedance and is guided to the output terminal OUT. The phase of the output in the amplification stage, which is input to a certain node of the output-side transmission line, and the phase of the output in the amplification stages up to the previous stage, which is input from the previous node via the unit line, agree with each other, and therefore, the signals are superimposed and become large. As described above, the terminator (terminating resistor) is not used on the first stage side, and therefore, power that is consumed as a DC (direct current) becomes small, and as a result, high efficiency is achieved.

Figure 2:
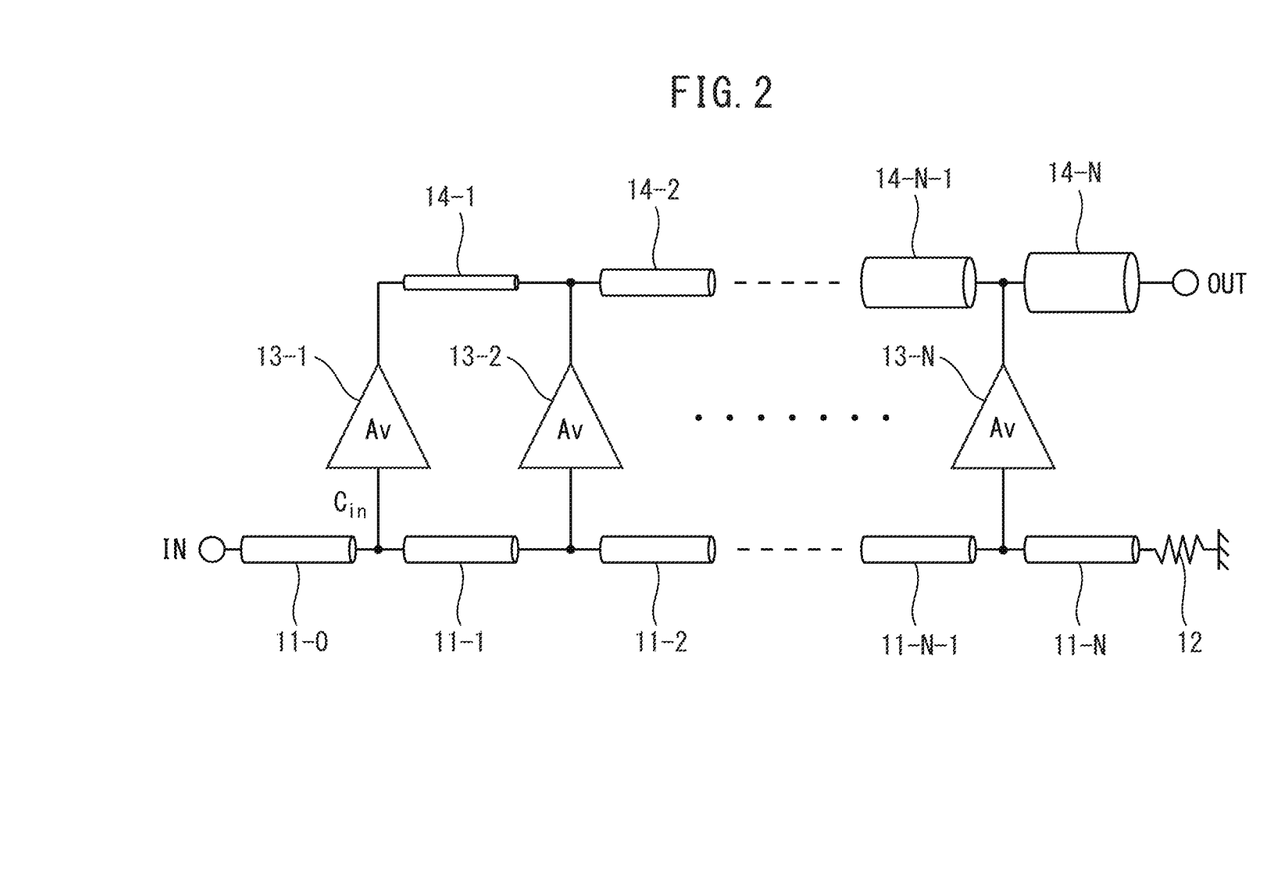
FIG. 2 is a circuit diagram illustrating the configuration of the distributed amplifier in FIG. 1 by basic circuit elements.

FIG. 2 is a circuit diagram illustrating the configuration of the distributed amplifier in FIG. 1 by basic circuit elements.

The distributed amplifier has an input-side transmission line, an amplification circuit, and an output-side transmission line. The input-side transmission line has a unit transmission line 11-0 in the initial stage, an input-side serial line formed by connecting in series N (N: integer not less than 2) unit transmission lines 11-1 to 11-N having the same line length, and an input-side terminating resistor 12. The unit transmission line in the initial stage, the input-side serial line, and the input-side terminating resistor 12 are connected in series between the input terminal IN and the reference potential source (0 V). The unit transmission line 11-0 in the initial stage of the input-side serial line does not relate directly to the operation of the distributed amplifier, and therefore, explanation is given on the assumption that the unit transmission line 11-0 is not included in the input-side serial line.

The amplification circuit has amplifiers (AV) 13-1 to 13-N in N stages and the input of the kth (k: integer not less than 1 and not more than N) amplifier 13-$k$ is connected to the input-side node of the unit transmission line 11-$k$ of the input-side serial line. The output-side transmission line includes N transmission lines 14-1 to 14-N each being connected between the neighboring outputs of the N amplifiers 13-1 to 13-N and each having the same line length as that of the unit transmission lines 11-0 to 11-N. The N transmission lines 14-1 to 14-N are connected in series and form the output-side serial line. The transmission line 14-N in the final stage of the output-side serial line is connected to the output terminal OUT.

The output in each stage of the amplification circuit is connected to the output-side serial line and the amplified signals are combined in the same phase and are guided to the output terminal OUT. In the output-side transmission line in FIG. 2, in order to create a ratio of impedance, the line width of the transmission line in each stage is gradually increased toward the output side. For example, the line width of the transmission line of the output-side serial line is doubled each time the stage is incremented by one.

In the distributed amplifier in FIG. 2, output power $P_{out}$ is in proportion to output power $P_{unit}$ of the unit amplifier (Av) and the number N of stages and is expressed by equation (1) below.

$$P_{out} = nP_{unit} \quad (1)$$

Consequently, it is possible to increase the output power of the distributed amplifier by increasing the number N of stages of the amplifier. However, as described previously, if the number of stages is increased, it is also necessary to increase the line width and in view of the layout, it is not possible to increase the number N of stages too much, and therefore, the number N of stages is generally set to about five to ten.

Further, the cutoff frequency of the distributed amplifier is considered. The cutoff frequency is the upper limit frequency at which the amplification factor becomes 1 or more, corresponding to the upper limit frequency of a wideband amplifier. If the input capacitance when represented by an equivalent circuit of the amplifier (Av) in the amplification stage is taken to be $C_{in}$, a cutoff frequency $f_c$ of the distributed amplifier is expressed by equation (2) by using $C_{in}$ and N.

CUTOFF FREQUENCY (2)

$$f_c = \frac{1}{50\pi C_{in}} \cdot \frac{1}{\sqrt{N}}$$

Derivation of equation (2) is explained briefly.

A characteristic impedance Zo of the input-side transmission line is expressed by equation (3) by using the input capacitance $C_{in}$ and an inductance L and the design is normally so that Zo becomes 50Ω.

$$Z_0 = \sqrt{\frac{L}{C_{in}}} = 50 \quad (3)$$

Further, the cutoff frequency of the input-side transmission line when the number of stages is set to N as in the distributed amplifier is expressed by equation (4).

$$f_c = \frac{1}{\pi\sqrt{LC_{in}}} \cdot \frac{1}{\sqrt{N}} \quad (4)$$

From equation (3), the inductance L is found and by substituting the inductance L in equation (4), equation (2) that does not use L is derived.

If the size of the transistor that is used in the amplification stage is increased for the purpose of increasing output power, the cutoff frequency is reduced as expressed by equation (2) because the input capacitance $C_{in}$ increases. Similarly, there is such a problem that the cutoff frequency is reduced even if the number N of stages is increased. Consequently, it is considered to increase the cutoff frequency by halving the size of the transistor that is used in the amplification stage in order to increase the number of stages.

Figure 3:
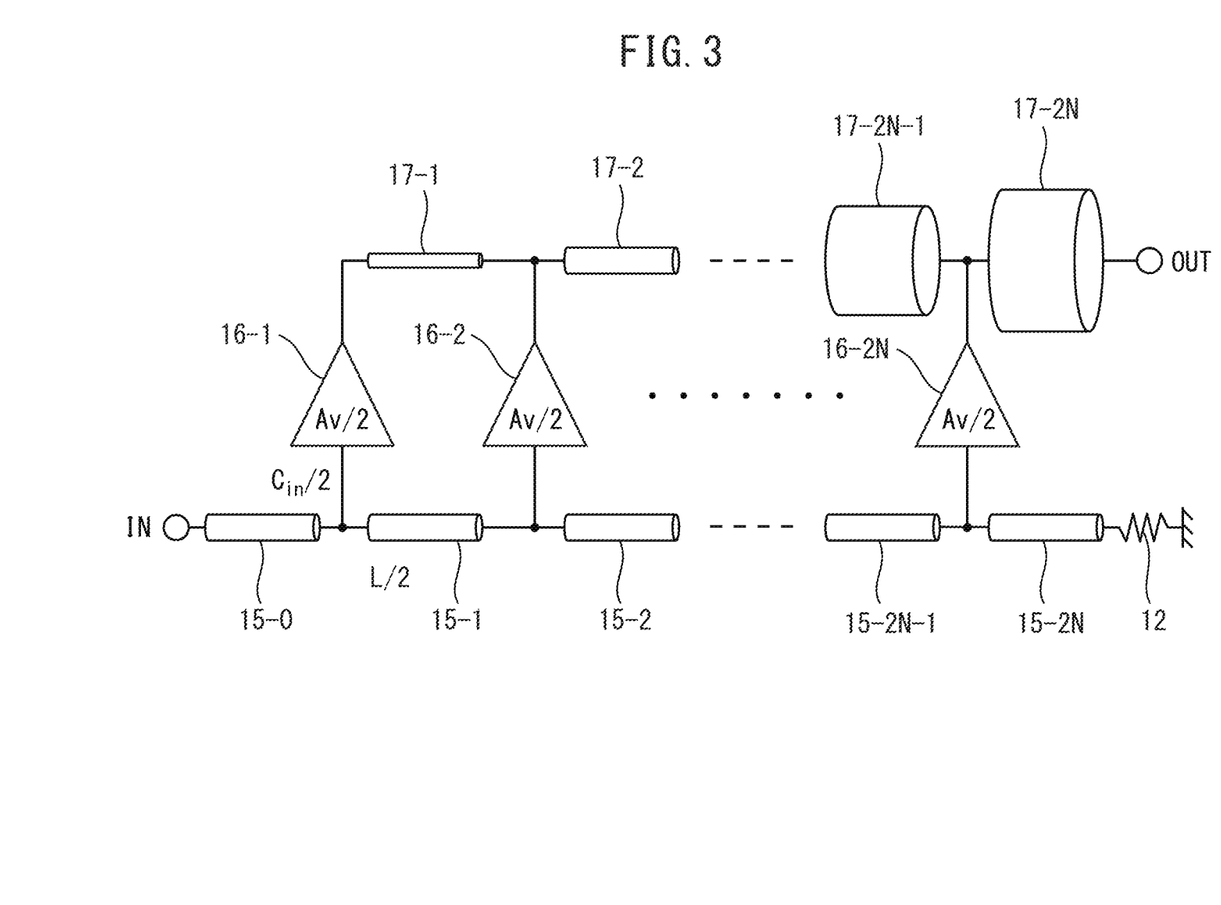
FIG. 3 is a circuit diagram in the case where the distributed amplifier in FIG. 2 is modified by halving the size of the transistor of the amplifier (Av) and doubling the number of stages to 2N.

FIG. 3 is a circuit diagram in the case where the distributed amplifier in FIG. 2 is modified by halving the size of the transistor of the amplifier (Av) and doubling the number of stages to 2N.

The number of stages of unit transmission lines 15-1 to 15-2N in the input-side serial line, the number of stages of amplifiers (AV/2) 16-1 to 16-2N in the amplification circuit, and the number of stages of transmission lines 17-1 to 17-2N in the output-side serial line are 2N, which is twice N. The transistor size of the amplifiers (AV/2) 16-1 to 16-2N is half that of the amplifiers (AV) 13-1 to 13-N in FIG. 2, but the number of stages is doubled, and therefore, the transistor size of the whole of the amplification circuit is the same and the output power is the same as that expressed by equation (1). The inductance of the unit transmission lines 15-1 to 15-2N is set so as to satisfy equation (3), and therefore, the inductance of the unit transmission line is L/2. Because the transistor size in each stage is halved, the capacitance is halved to $C_{in}/2$ and the number of stages is 2N, and therefore, the output power $P_{out}$ and the cutoff frequency $f_c$ are expressed by equations (5) and (6) below.

OUTPUT POWER (5)

$$P_{out} = 2n\frac{P_{unit}}{2}$$

CUTOFF FREQUENCY (6)

$$f_c = \frac{1}{50\pi C_{in}} \cdot \sqrt{\frac{2}{N}}$$

As expressed by equation (6), the cutoff frequency becomes $2^{1/2}$ times, and therefore, it is possible to widen the band. However, if the number of stages is doubled, as illustrated in FIG. 3, it is necessary to increase the line width of the transmission line on the side closer to the output terminal in the output-side transmission line, and therefore, in fact, it is difficult to design a layout. For example, in the case where the ratio of line width between the neighboring stages is set to 2, the line width in the Nth stage is $2^N$ times the line width in the initial stage, but in the case of 2N stages, the line width in the 2Nth stage is $2^{2N}$ times the line width in the initial stage.

Patent Document 1 discloses a distributed amplifier in which the circuit branches into two distributed amplification circuits from the input-side transmission line and their outputs are combined. Patent Document 1 only discloses the distributed amplifier having the distributed amplification circuits in the number N=2, i.e., the four amplifiers (transistors), but it can be considered to modify the distributed amplifier so as to have the distributed amplification circuits in the number N≥2.

Figure 4:
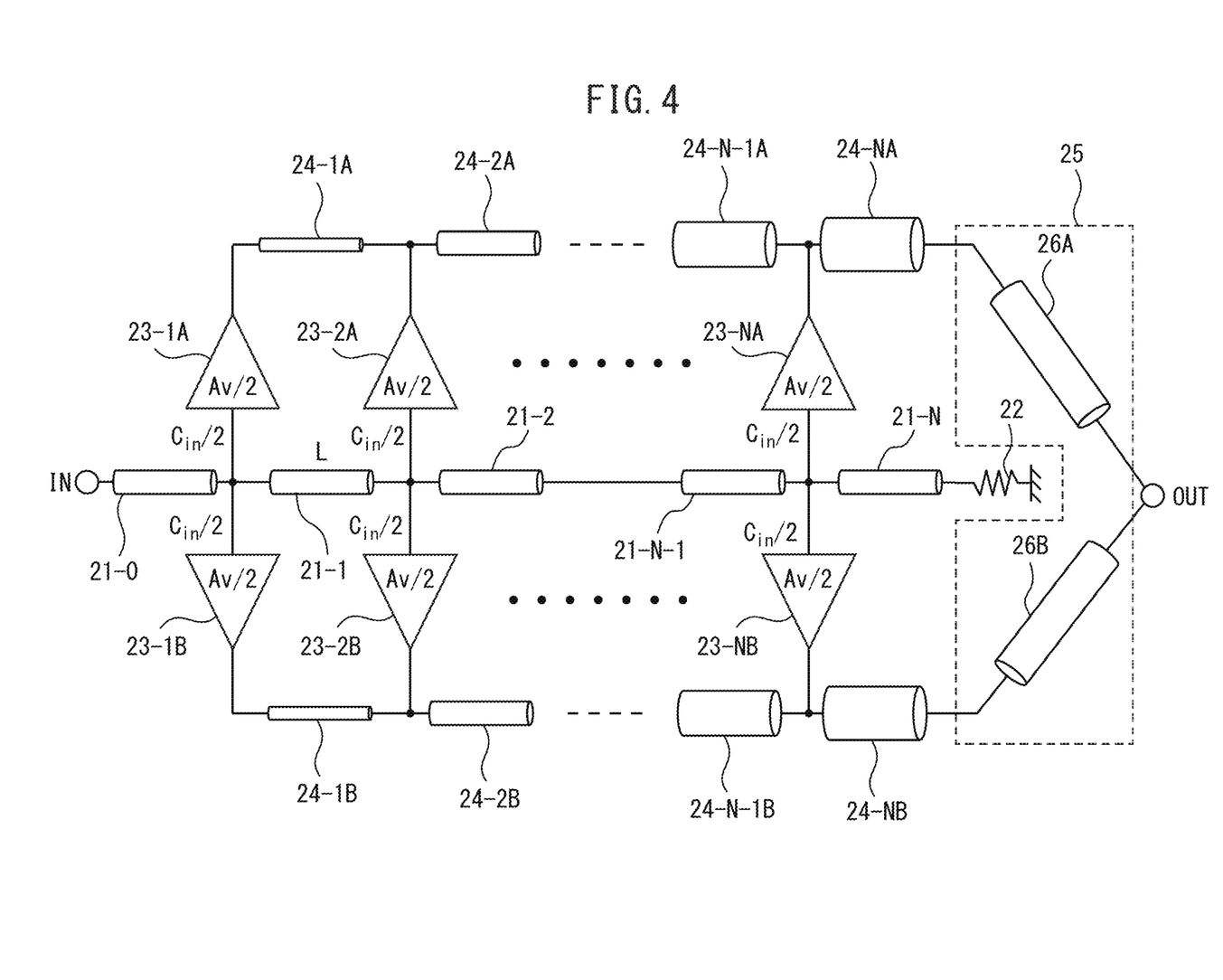
FIG. 4 is a circuit diagram illustrating an example in which the distributed amplifier having N (N≥2) amplification stages is modified to that in which the circuit branches into two distributed amplification circuits from the input-side transmission line.

FIG. 4 is a circuit diagram illustrating an example in which the distributed amplifier having N (N>2) amplification stages is modified to that in which the circuit branches into two distributed amplification circuits from the input-side transmission line.

The distributed amplifier in the modification example in FIG. 4 has an input-side transmission line, a first amplification circuit, a second amplification circuit, a first output-side transmission line, a second output-side transmission line, and a combination circuit 25. The input-side transmission line has an initial-stage transmission line 21-0, an input-side serial line formed by connecting in series N unit transmission lines 21-1 to 21-N having the same line length, and an input-side terminating resistor 22. The first amplification circuit has amplifiers (AV/2) 23-1A to 23-NA in N stages and the input of the kth (k: integer not less than 1 and not more than N) amplifier 23-kA is connected to the input-side node of the unit transmission line 21-k of the input-side serial line. The second amplification circuit has amplifiers (AV/2) 23-1B to 23-NB in N stages and the input of the kth (k: integer not less than 1 and not more than N) amplifier 23-kB is connected to the input-side node of the unit transmission line 21-k of the input-side serial line. The first output-side serial line includes N transmission lines 24-1A to 24-NA each being connected between the neighboring outputs of the N amplifiers 23-1A to 23-NA and each having the same line length as that of the unit transmission lines 21-1 to 21-N. The N transmission lines 24-1A to 24-NA are connected in series and form the first output-side serial line. The second output-side serial line includes N transmission lines 24-1B to 24-NB each being connected between the neighboring outputs of the N amplifiers 23-1B to 23-NB and each having the same line length as that of the unit transmission lines 21-1 to 21-N. The N transmission lines 24-1B to 24-NB are connected in series and form the second output-side serial line. The combination circuit 25 has a first combination line 26A that is connected between the transmission line 24-NA in the final stage of the first output-side serial line and the output terminal OUT, and a second combination line 26B that is connected between the transmission line 24-NB in the final stage of the second output-side serial line and the output terminal OUT. The transistor size of the amplifiers (AV/2) 23-1A to 23-NA and 23-1B to 23-NB is half that of the amplifiers (AV) 13-1 to 13-N in FIG. 2, but the circuit has the two branched systems, and therefore, the transistor size of the whole of the first and second amplification circuits is the same. Consequently, the output power is the same as that expressed by equation (1). Because the transistor size in each stage is halved, the capacitance is halved to $C_{in}/2$, but branching occurs from the same portion and the total capacitance at the branching point is $C_{in}$, and therefore, the cutoff frequency is the same as that expressed by equation (2). In other words, it is not possible to increase the cutoff frequency. The inductance of the unit transmission lines 21-1 to 21-N is set so as to satisfy equation (3) and the total capacitance at the branching point is $C_{in}$ as described above, and therefore, the inductance is L.

In embodiments to be explained below, a distributed amplifier is provided, whose cutoff frequency has been increased while keeping output power, i.e., without changing the total transistor size and without increasing the overall size too much.

Figure 5:
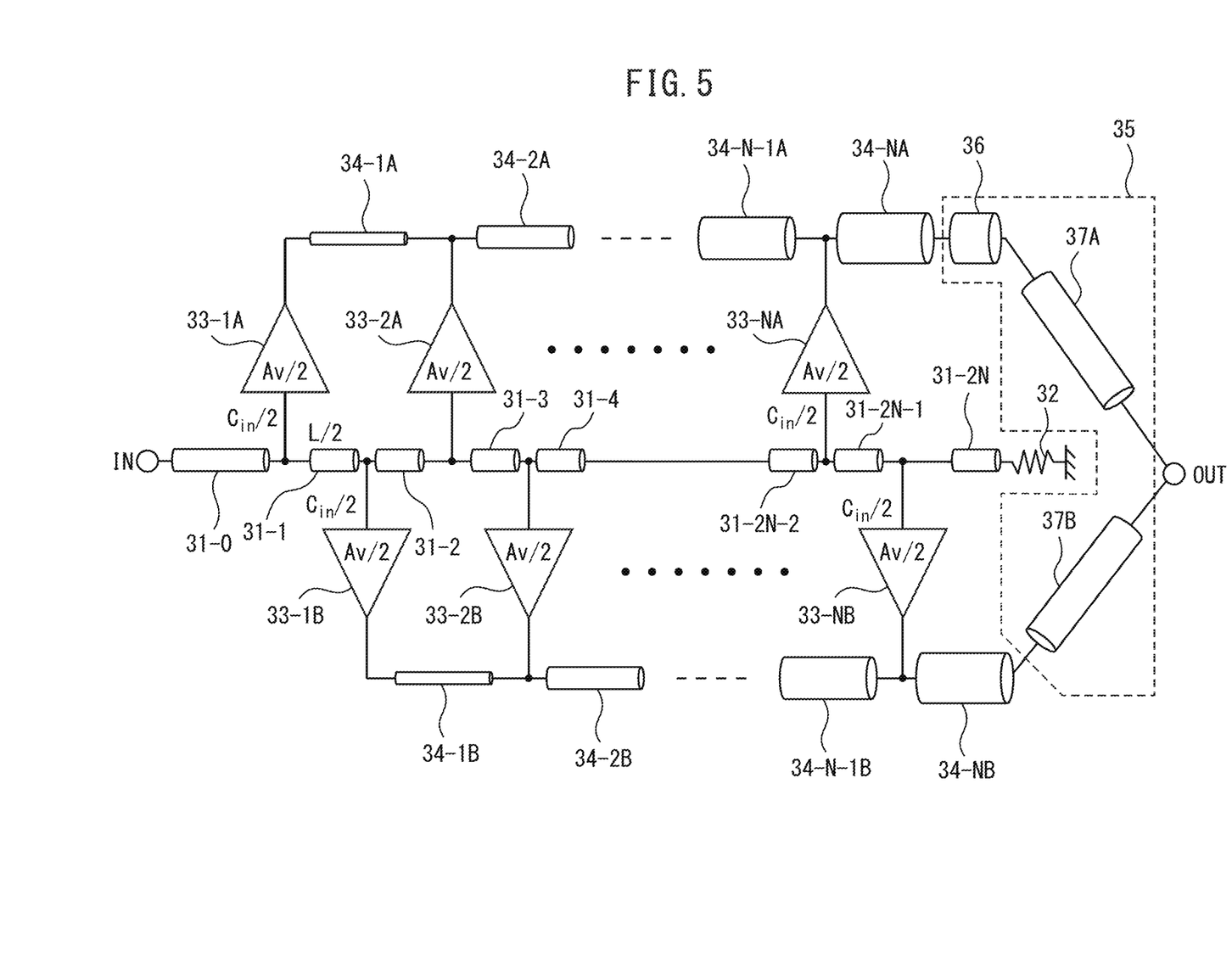
FIG. 5 is a circuit diagram of a distributed amplifier of a first embodiment.

FIG. 5 is a circuit diagram of a distributed amplifier of a first embodiment.

The distributed amplifier of the first embodiment has an input-side transmission line, a first amplification circuit, a second amplification circuit, a first output-side transmission line, a second output-side transmission line, and a combination circuit 35. The input-side transmission line has an initial stage transmission line 31-0, an input-side serial line formed by connecting in series 2N unit transmission lines 31-1 to 31-2N having the same line length, and an input-side terminating resistor 32. The first amplification circuit has amplifiers (AV/2) 33-1A to 33-NA in N stages and the input of the kth (k: integer not less than 1 and not more than N) amplifier 33-kA is connected to the input-side node of the unit transmission line 31-(2k-1) of the input-side serial line. The second amplification circuit has amplifiers (AV/2) 33-1B to 33-NB in N stages and the input of the kth amplifier 33-kB is connected to the input-side node of the unit transmission line 31-2k of the input-side serial line. The first output-side transmission line includes N transmission lines 34-1A to 34-NA each being connected between the outputs of the N amplifiers 33-1A to 33-NA and each having a line length twice that of each of the unit transmission lines 31-0 to 31-2N. The N transmission lines 34-1A to 34-NA form the first output-side serial line. The second output-side transmission line includes N transmission lines 34-1B to 34-NB each being connected between the outputs of the N amplifiers 33-1B to 33-NB and each having a line length twice that of each of the unit transmission lines 31-0 to 31-2N. The N transmission lines 34-1B to 34-NB form the second output-side serial line. The combination circuit 35 has a phase adjustment line 36 and a first combination line 37 that are connected in series between the transmission line 34-NA in the final stage of the first output-side serial line and the output terminal OUT. The combination circuit 35 further has a second combination line 37B that is connected between the transmission line 34-NB in the final stage of the second output-side serial line and the output terminal OUT.

As described above, in the distributed amplifier of the first embodiment, the branching portions are arranged alternately in the input-side serial line and are connected to the first and second amplification circuits. The output in each stage of the first amplification circuit is in the same phase at each node in the first output-side serial line and the line width of the transmission lines 34-1A to 34-NA increases stepwise, and therefore, the intensity is added. This is also the same in the second amplification circuit and the second output-side serial line. However, the phase of the output of the transmission line 34-NA in the final stage of the first output-side serial line is ahead of the phase of the output of the transmission line 34-NB in the final stage of the second output-side serial line by the amount corresponding to the amount of delay of the unit transmission line. Because of this, in the combination circuit 35, the phase adjustment line 36 delays the output of the transmission line 34-NA by the amount corresponding to the amount of delay of the unit transmission line, and thereby, the phase of the output of the transmission line 34-NA is matched with the phase of the output of the transmission line 34-NB.

The transistor size of the amplifiers (AV/2) 33-1A to 33-NA and 33-1B to 33-NB is half that of the amplifiers (AV) 13-1 to 13-N in FIG. 2, but the circuit has the two branched systems, and therefore, the total transistor size of the whole of the first and second amplification circuits is the same. Consequently, the output power is expressed by equation (7) below, which is the same as that expressed by equation (1).

$$P_{out} = 2 \times N \frac{P_{unit}}{2} \quad (7)$$

The inductance of the unit transmission lines 31-1 to 31-2N is set so as to satisfy equation (3) and the capacitance at the branching point is halved to $C_{in}/2$, and therefore, the inductance is L/2.

On the other hand, the cutoff frequency of the distributed amplifier of the first embodiment is expressed by equation (8) below.

$$f_c = \frac{1}{50\pi C_{in}} \cdot \sqrt{\frac{2}{N}} \quad (8)$$

As described above, the cutoff frequency of the distributed amplifier of the first embodiment is $2^{1/2}$ times that in the example in FIG. 2 and FIG. 4, and therefore, it is possible to implement an increase in band of the distributed amplifier. Further, the number of stages of the first and second amplification circuits is N and is the same as that in the case in FIG. 2 and FIG. 4, and the number of stages of the first and second output-side serial lines is also N, and therefore, the line width of the transmission line is about the same as that in FIG. 2 and it is possible to design a layout.

Figure 6:
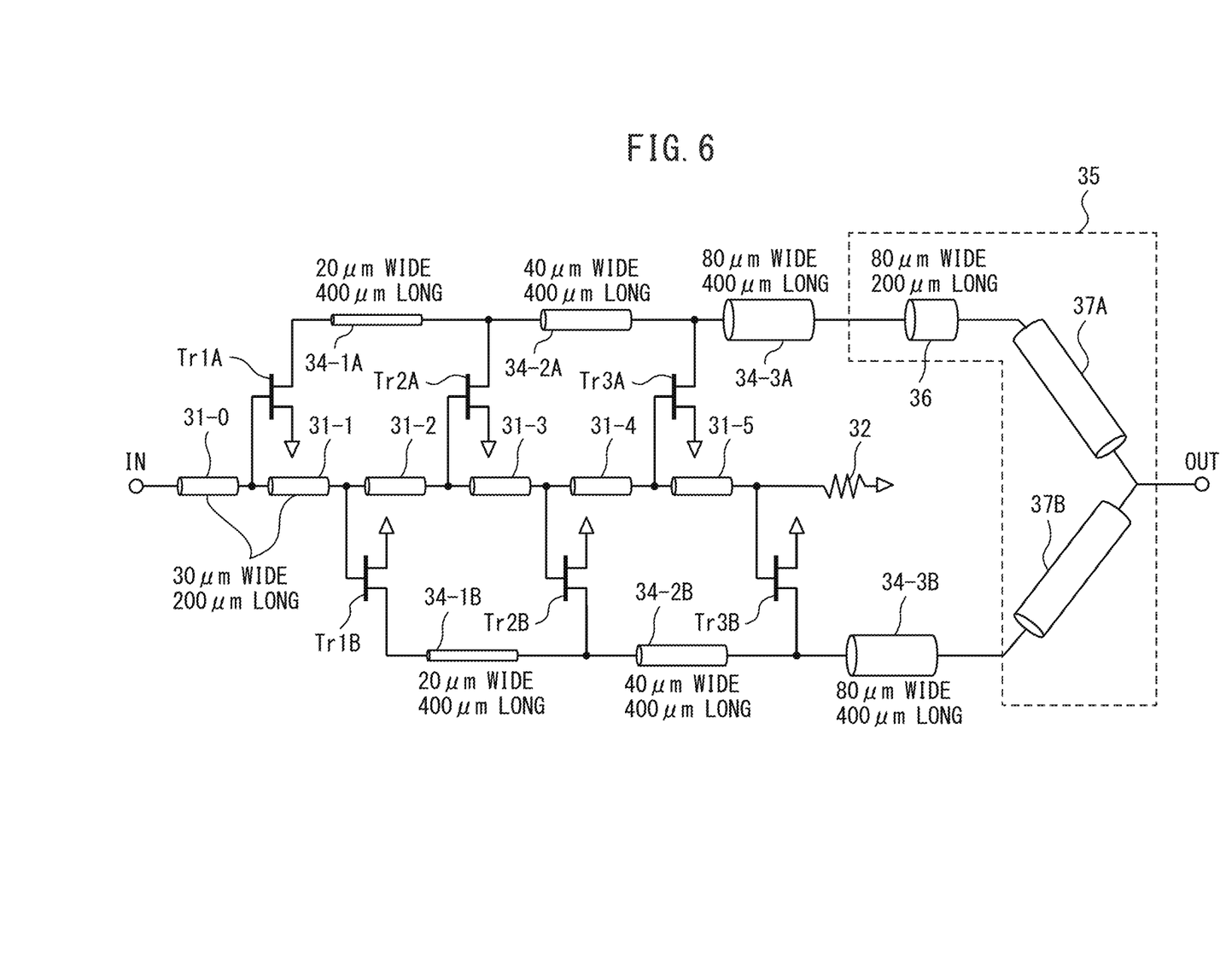
FIG. 6 is a circuit diagram in the case where the distributed amplifier of the first embodiment is implemented on a semiconductor substrate having a dielectric constant of 10 and describes a specific shape of a transmission line, in which the number of stages of the first and second amplification circuits is set to three and the amplification stage is represented by a transistor.

FIG. 6 is a circuit diagram in the case where the distributed amplifier of the first embodiment is implemented on a semiconductor substrate having a dielectric constant of 10 and describes a specific shape of a transmission line, in which the number of stages of the first and second amplification circuits is set to three and the amplification stage is represented by a transistor.

The initial stage transmission line 31-0 and the unit transmission lines 31-1 to 31-5 of the input-side transmission line have a width of 30 μm and a length of 200 μm. Here, the unit transmission line 31-6 is not provided. The length of each of the transmission lines 34-1A to 34-3A and 34-1B to 34-3B of the first and second output-side serial lines is 400 μm and the line width increases stepwise in such a manner as 20 μm, 40 μm, and 80 μm, the line width being twice the previous line width. The phase adjustment unit 36 of the combination circuit 35 is a transmission line having a width of 80 μm and a length of 200 μm.

The first embodiment is an example in which the circuit branches into two systems, but the number of branched systems is not limited to two, and may be three or more. A second embodiment is an example in which the circuit branches into three systems.

Figure 7:
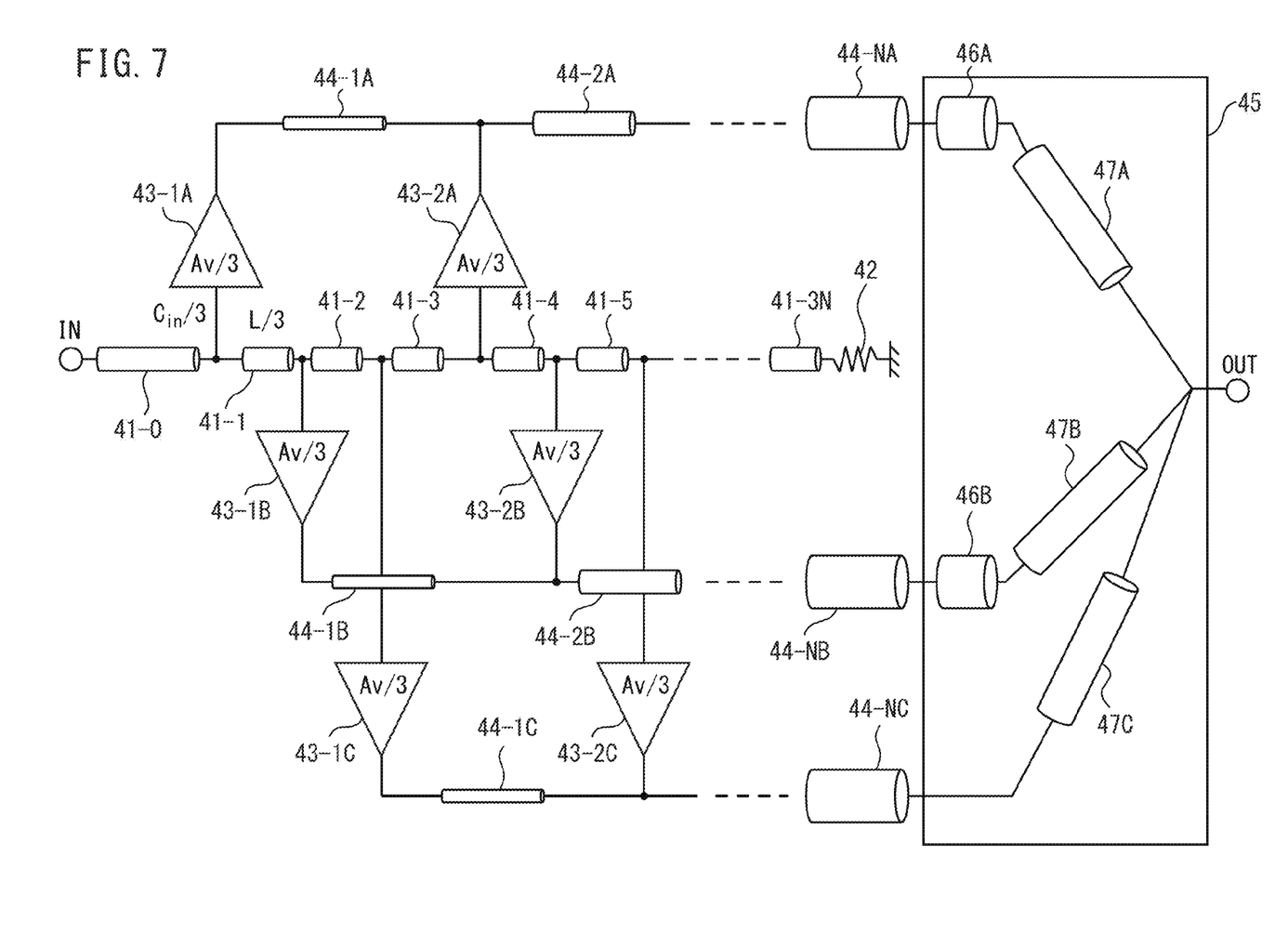
FIG. 7 is a circuit diagram of a distributed amplifier of the second embodiment.

FIG. 7 is a circuit diagram of a distributed amplifier of the second embodiment.

The distributed amplifier of the second embodiment has an input-side transmission line, first to third amplification circuits, first to third output-side transmission lines, and a combination circuit 45. The input-side transmission line has an initial stage transmission line 41-0, an input-side serial line formed by connecting in series 3N unit transmission lines 41-1 to 41-3N having the same line length, and an input-side terminating resistor 42. The first amplification circuit has amplifiers (AV/3) 43-1A to 43-NA in N stages and the input of the kth (k: integer not less than 1 and not more than N) amplifier 43-kA is connected to the input-side node of the unit transmission line 41-(3k-2) of the input-side serial line. The second amplification circuit has amplifiers (AV/2) 43-1B to 43-NB in N stages and the input of the kth amplifier 43-kB is connected to the input-side node of the unit transmission line 41-(3k-1) of the input-side serial line. The third amplification circuit has amplifiers (AV/2) 43-1C to 43-NC in N stages and the input of the kth amplifier 43-kC is connected to the input-side node of the unit transmission line 41-3k of the input-side serial line.

The first output-side transmission line includes N transmission lines 44-1A to 44-NA each being connected between the neighboring outputs of the N amplifiers 43-1A to 43-NA and each having a line length there times that of each of the unit transmission lines 41-0 to 41-3N. The N transmission lines 44-1A to 44-NA form the first output-side serial line. The second output-side serial line includes N transmission lines 44-1B to 44-NB each being connected between the neighboring outputs of the N amplifiers 43-1B to 43-NB and each having a line length there times that of each of the unit transmission lines 41-0 to 41-3N. The N transmission lines 44-1B to 44-NB form the second output-side serial line. The third output-side serial line includes N transmission lines 44-1C to 44-NC each being connected between the neighboring outputs of the N amplifiers 43-1C to 43-NC and each having a line length there times that of each of the unit transmission lines 41-0 to 41-3N. The N transmission lines 44-1C to 44-NC form the third output-side serial line. The combination circuit 45 has a phase adjustment line 46A and a first combination line 47A that are connected in series between the transmission line 44-NA in the final stage of the first output-side serial line and the output terminal OUT. The combination circuit 45 further has a phase adjustment line 46B and a second combination line 47B that are connected in series between the transmission line 44-NB in the final stage of the second output-side serial line and the output terminal OUT. Furthermore, the combination circuit 45 has a third combination line 47C that is connected between the transmission line 44-NC in the final stage of the third output-side serial line and the output terminal OUT. The phase adjustment line 46A has a line length twice that of the unit transmission line and the phase adjustment line 46B has the same line length as that of the unit transmission line.

In the second embodiment, the circuit is branched into three systems, but the circuit can be branched into four or more systems and in the case where the circuit is branched into M systems for generalization, the input-side serial line is formed by connecting in series M×3N unit transmission lines having the same line length. The i-th (i: integer not less than 1 and not more than M) amplification circuit of the M amplification circuits has N amplifiers that take the input node of the ((k−1) M+i)-th (i: integer not less than 1 and not more than N) input-side serial line to be its input.

In the case where the circuit is branched into M systems for generalization, the transistor size of each amplifier is 1/M of that of the amplifiers (AV) 13-1 to 13-N in FIG. 2, but the circuit has M branched systems. Because of this, the transistor size of the whole of the M amplification circuits is the same. Consequently, the output power is expressed by equation (9) below, which is the same as equation (1).

$$P_{out} = M \times N \frac{P_{unit}}{M} \quad (9)$$

The inductance of the unit transmission line is set so as to satisfy equation (3) and the capacitance at the branching point is halved to $C_{in}/M$, and therefore, the inductance is $L/M$.

On the other hand, the cutoff frequency is expressed by equation (10) below.

$$f_c = \frac{1}{50\pi C_{in}} \cdot \sqrt{\frac{M}{N}} \tag{10}$$

As described above, the cutoff frequency of the distributed amplifier of the second embodiment becomes $2^{1/M}$ times that in the example in FIG. 2 and FIG. 4, and therefore, it is possible to implement a wideband of the distributed amplifier. Further, the number of stages of the M amplification circuits is N, the same as that in the case in FIG. 2 and FIG. 4, and the number of stages of the M output-side transmission lines is also N, and therefore, the line width of the transmission line is about M times that in FIG. 2 and it is possible to design a layout.

The distributed amplifiers of the first and second embodiments have a plurality of amplification systems including sets of a plurality of branched amplification circuits and the output-side transmission lines, and combine those outputs by addition. If part of the plurality of amplification systems are brought into the non-operating state, it is possible to change the output power. In a third embodiment that is explained next, it is possible to change the output power by controlling each amplification system to operate or not.

Figure 8:
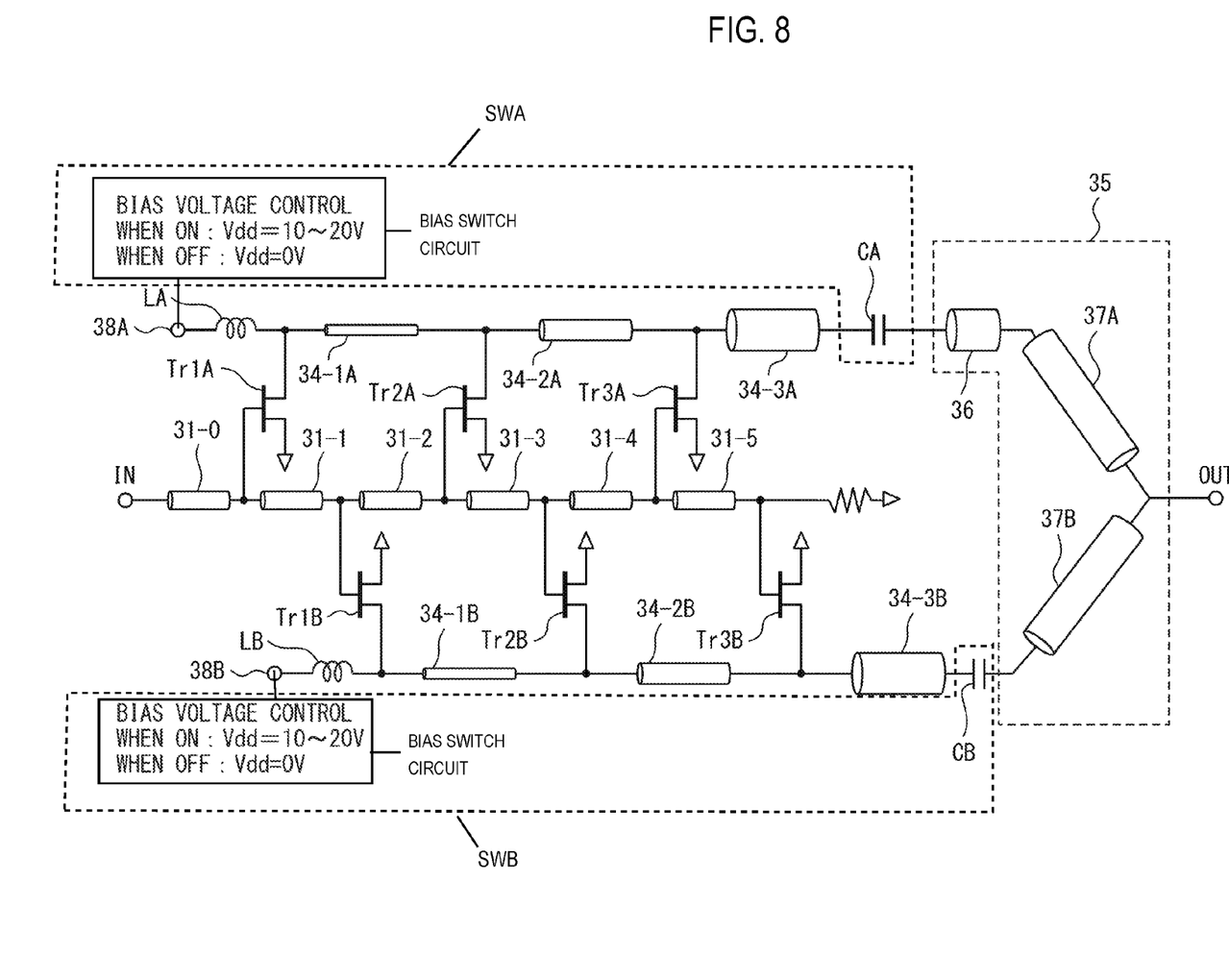
FIG. 8 is a circuit diagram of a distributed amplifier of the third embodiment.

FIG. 8 is a circuit diagram of a distributed amplifier of the third embodiment.

The distributed amplifier of the third embodiment differs from the distributed amplifier of the first embodiment illustrated in FIG. 6 in the following items and the other parts are that same. In FIG. 8, the same reference symbol is attached to the same part as that in FIG. 6. The input side of the transmission line 34-1A in the initial stage of the first output-side serial line, i.e., the output terminal of Tr1A is connected to a first control terminal 38A via an inductance element LA. Similarly, the input side of the transmission line 34-1B in the initial stage of the second output-side serial line, i.e., the output terminal of Tr1B is connected to a second control terminal 38B via an inductance element LB. Further, between the output side of the transmission line 34-3A in the final stage of the first output-side serial line and the combination circuit 35, a DC-cut capacitance element CA is provided and between the output side of the transmission line 34-3B in the final stage of the second output-side serial line and the combination circuit 35, a DC-cut capacitance element CB is provided.

If the bias voltage that is applied to the first control terminal 38A is set to Vdd=10 to 20 V, the first amplification system (the first amplification circuit and the first output-side serial line) operates and if the bias voltage is set to Vdd=0 V, the first amplification system no longer operates. Further, if the bias voltage that is applied to the second control terminal 38B is set to Vdd=10 to 20 V, the second amplification system (the second amplification circuit and the second output-side serial line) operates and if the bias voltage is set to Vdd=0 V, the second amplification system no longer operates. A switch (SWA and SWB in FIG. 8) for switching the bias voltages Vdd that are applied to the first control terminal 38A and to the second control terminal 38 is provided.

The output side of the transmission line 34-3A in the final stage and the combination circuit 35 is connected by the capacitance element CA, and the output side of the transmission line 34-3B in the final stage and the combination circuit 35 is connected by the capacitance element CB, and therefore, only high-frequency components are transmitted. Because of this, when the first and second amplification systems are in the operating state, only the high-frequency components of the amplified signals are transmitted to the combination circuit 35 from the first and second amplification systems and the high-frequency components are combined. Only the high-frequency components are necessary for the distributed amplifier and DC components are not necessary, and therefore, there is no problem. When one of the first amplification system and the second amplification system is in the non-operating state, the signals (high-frequency components) of the amplification system in the non-operating state are not transmitted and this only results in that the signals are not added, and therefore, there is no problem in particular.

As above, the first to third embodiments are explained and the advantage that is obtained from the distributed amplifiers of the embodiments is explained by taking the first embodiment as an example.

Figure 9:
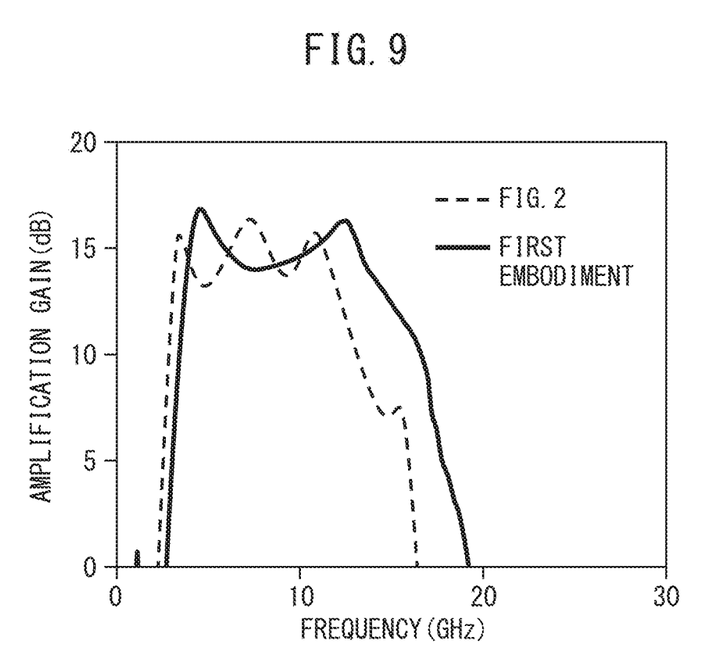
FIG. 9 is a diagram illustrating the simulation results of the frequency characteristics of the amplification gain (dB) of the distributed amplifier of the first embodiment and the distributed amplifier in FIG. 2, and the solid line indicates the characteristics of the distributed amplifier of the first embodiment and the broken line indicates the characteristics of the distributed amplifier in FIG. 2.

FIG. 9 is a diagram illustrating the simulation results of the frequency characteristics of the amplification gain (dB) of the distributed amplifier of the first embodiment and the distributed amplifier in FIG. 2, and the solid line indicates the characteristics of the distributed amplifier of the first embodiment and the broken line indicates the characteristics of the distributed amplifier in FIG. 2.

As illustrated in FIG. 9, the values of the amplification gains are about 15 dB and similar to each other, but it is known that the cutoff frequency shifts toward the high-frequency side and the band is widened. As described above, according to the embodiments, it is possible to implement a distributed amplifier that can obtain output power in substantially the same magnitude and which has increased the cutoff frequency with a comparatively small increase in size.

As described above, according to the embodiments, a distributed amplifier whose cutoff frequency has been increased without increasing the size while maintaining output power is implemented.

All examples and conditional language provided herein are intended for pedagogical purposes of aiding the reader in understanding the invention and the concepts contributed by the inventor to further the art, and are not to be construed as limitations to such specifically recited examples and conditions, nor does the organization of such examples in the specification relate to a illustrating of the superiority and inferiority of the invention. Although one or more embodiments of the present invention have been described in detail, it should be understood that the various changes, substitutions, and alterations could be hereto without departing from the spirit and scope of the invention.

What is claimed is:
1. A distributed amplifier comprising:
an input-side transmission line;
M (M: integer not less than 2) amplification circuits;
M output-side transmission lines provided in accordance with the M amplification circuits; and
a combination circuit configured to combine outputs of the M output-side transmission lines; wherein
the input-side transmission line includes an input-side serial line formed by connecting in series M×N (N:

integer not less than 2) unit transmission lines each including the same line length, and an input-side terminating resistor, the M amplification circuits each includes N amplifiers and the N amplifiers of the i-th (i: integer not less than 1 and not more than M) amplification circuit take the input node of the ((k−1) M+i)-th (k: integer not less than 1 and not more than N) input-side transmission line to be the input, and the output-side transmission line includes an output-side serial line including N transmission lines each being connected in series between the neighboring outputs of the N amplifiers and each including a line width with which the phase of the output of the amplifier in each stage agrees to one another, wherein the combination circuit includes a phase adjustment unit configured to match the phase of the output of each of the M output-side serial lines with one another.

2. The distributed amplifier according to claim 1, wherein each of the N transmission lines of the output-side transmission line includes a line width that is wider than the line width in the previous stage.

3. The distributed amplifier according to claim 2, wherein each of the N transmission lines of the output-side transmission line includes a line width twice the line width in the previous stage.

4. The distributed amplifier according to claim 1, wherein at least one of the M amplification circuits and the M output-side transmission lines is capable of switching between operating and non-operating by a switch circuit.

5. The distributed amplifier according to claim 4, wherein the switch circuit includes:
   a bias switch circuit configured to switch bias voltages that are supplied to the transmission line in the initial stage of the output-side transmission line; and
   a DC-cut capacitance element that is provided between the output in the final stage of the output-side transmission line and the combination circuit.

6. A distributed amplifier comprising:
an input-side transmission line;
M (M: integer not less than 2) amplification circuits;
M output-side transmission lines provided in accordance with the M amplification circuits; and
a combination circuit configured to combine outputs of the M output-side transmission lines; wherein the input-side transmission line includes an input-side serial line formed by connecting in series M×N (N: integer not less than 2) unit transmission lines each including the same line length, and an input-side terminating resistor, the M amplification circuits each includes N amplifiers and the N amplifiers of the i-th (i: integer not less than 1 and not more than M) amplification circuit take the input node of the ((k−1) M+i)-th (k: integer not less than 1 and not more than N) input-side transmission line to be the input, and the output-side transmission line includes an output-side serial line including N transmission lines each being connected in series between the neighboring outputs of the N amplifiers and each including a line width with which the phase of the output of the amplifier in each stage agrees to one another, wherein each transmission line of the output-side transmission line includes a line length M times the line length of the unit transmission line, wherein
the combination circuit includes a phase adjustment unit configured to match the phase of the output of each of the M output-side serial lines with one another.

7. The distributed amplifier according to claim 6, wherein each of the N transmission lines of the output-side transmission line includes a line width that is wider than the line width in the previous stage.

8. The distributed amplifier according to claim 7, wherein each of the N transmission lines of the output-side transmission line includes a line width twice the line width in the previous stage.

9. The distributed amplifier according to claim 8, wherein at least one of the M amplification circuits and the M output-side transmission lines is capable of switching between operating and non-operating by a switch circuit.

10. The distributed amplifier according to claim 9, wherein
the switch circuit includes:
   a bias switch circuit configured to switch bias voltages that are supplied to the transmission line in the initial stage of the output-side transmission line; and
   a DC-cut capacitance element that is provided between the output in the final stage of the output-side transmission line and the combination circuit.

* * * * *